US006998865B2

(12) United States Patent
Bard et al.

(10) Patent No.: US 6,998,865 B2
(45) Date of Patent: Feb. 14, 2006

(54) SEMICONDUCTOR DEVICE TEST ARRANGEMENT WITH REASSIGNABLE PROBE PADS

(75) Inventors: Karen A. Bard, Hopewell Junction, NY (US); S. Sundar Kumar Iyer, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 10/013,789

(22) Filed: Dec. 10, 2001

(65) Prior Publication Data

US 2003/0107391 A1   Jun. 12, 2003

(51) Int. Cl.
*G01R 31/02* (2006.01)
*G01R 31/26* (2006.01)

(52) U.S. Cl. ............... 324/765; 324/763; 324/158.1
(58) Field of Classification Search ............... 324/763, 324/765, 754, 73.1, 158.1; 257/48, 529, 257/665; 438/14–18, 132
See application file for complete search history.

(56) References Cited

U.S. PATENT DOCUMENTS

| | | | | |
|---|---|---|---|---|
| 4,064,493 A | * | 12/1977 | Davis ..................... | 365/96 |
| 4,152,627 A | * | 5/1979 | Priel et al. ............... | 365/227 |
| 4,853,628 A | * | 8/1989 | Gouldsberry et al. ..... | 324/763 |
| 4,862,243 A | * | 8/1989 | Welch et al. ............. | 257/529 |
| 5,202,624 A | | 4/1993 | Gheewala ................ | 324/754 |
| 5,708,291 A | * | 1/1998 | Bohr et al. .............. | 257/529 |
| 5,898,312 A | | 4/1999 | Uhling et al. ............ | 324/754 |
| 5,898,700 A | | 4/1999 | Kim ...................... | 714/718 |
| 5,973,504 A | | 10/1999 | Chong ................... | 324/754 |
| 5,982,188 A | | 11/1999 | Lysinger ................. | 324/763 |
| 6,060,899 A | | 5/2000 | Hamada ................. | 324/765 |
| 6,104,082 A | * | 8/2000 | Berlin et al. ............. | 257/665 |
| 6,175,145 B1 | | 1/2001 | Lee et al. ................ | 257/529 |
| 6,214,630 B1 | * | 4/2001 | Hsuan et al. ............ | 438/11 |
| 6,255,835 B1 | | 7/2001 | Oh et al. ................ | 324/763 |
| 6,277,674 B1 | | 8/2001 | Wang et al. ............. | 438/132 |
| 6,346,820 B1 | * | 2/2002 | Yamagami .............. | 324/763 |
| 6,368,902 B1 | | 4/2002 | Kothandaraman et al. .. | 438/132 |
| 6,433,404 B1 | | 8/2002 | Iyer et al. ............... | 257/529 |
| 6,506,634 B1 | * | 1/2003 | Kohyama ................ | 438/132 |
| 6,710,640 B1 | | 3/2004 | Kothandaraman et al. .. | 327/525 |

FOREIGN PATENT DOCUMENTS

| | | |
|---|---|---|
| EP | 661552 A2 * | 7/1995 |
| EP | 1122784 A3 | 8/2002 |
| WO | WO0193331 A2 | 12/2001 |

OTHER PUBLICATIONS

NN76091161 "IBM technical Disclosure Bulletin" Sep. 1976, US.*
Klee, et al., "A 0.13 um logic-based embedded DRAM technology with electrical fuses, Cu interconnect in SiLK, sub-7ns random access time and its extension to the 0.10 um generation.", Technical Digest, International Electron Device Meeting 2001, Washington, D.C., Dec. 2-5, 2001, pp. 407-411, (Four Pages).
IBM Technical Disclosure Bulletin, vol. 37, No. 12, Dec. 1994, p. 617, "Release Interface Tape Programmable Probe Pad". (One Page).

* cited by examiner

*Primary Examiner*—Paresh Patel
(74) *Attorney, Agent, or Firm*—Joseph P. Abate

(57) ABSTRACT

A test arrangement includes a semiconductor device, a first conductive pad electrically connected to the semiconductor device, a second conductive pad, and a programmable fuse. The second conductive pad is electrically connected to the semiconductor device through the programmable fuse.

4 Claims, 3 Drawing Sheets

SEMICONDUCTOR DEVICE TEST ARRANGEMENT WITH REASSIGNABLE PROBE PADS

BACKGROUND OF THE INVENTION

1. Field of the Invention

The present invention relates to test arrangements and, particularly, to test arrangements for semiconductor devices.

2. Description of the Related Art

Probe pads disposed on a semiconductor wafer provide the interface between a device under test (DUT) and an external tester. The probe pads are required to be large to interface to the tester, and can be 500 times the size of the DUT. In development, where hundreds of test macros can be assembled onto a single chip, the area of the probe pads can exceed 50% of the wafer area. Thus, the number of semiconductor devices which can be tested is limited by the space requirements of the probe pads.

For various known test arrangements, see, for example, U.S. Pat. No. 6,060,899, issued May 9, 2000, SEMICONDUCTOR DEVICE WITH TEST CIRCUIT, by Hamada, and U.S. Pat. No. 5,898,700, METHOD FOR TESTING A SEMICONDUCTOR WAFER, issued Apr. 27, 1999, which are both incorporated in their entireties herein by reference.

The present inventors believe that drawbacks in the art can be overcome.

SUMMARY OF THE INVENTION

According to the present invention, by adding programmable (e.g., polysilicon) fuses in series with semiconductor in-line test structures, and blowing the fuses (for example, electrically programmable fuses or e-fuses) after test, the probe pads can be reused or reassigned for other structures.

A test arrangement of the present invention includes a semiconductor device, a first conductive pad electrically connected to the device, a second conductive pad, and a programmable fuse. The second pad is electrically connected to the semiconductor device through the programmable fuse.

It is a principal object of the present invention to conserve space while enabling testing of semiconductor devices on a wafer.

Further and still other objects of the present invention will become more readily apparent when the following detailed description is taken in conjunction with the accompanying drawing figures.

DETAILED DESCRIPTION OF THE PREFERRED EMBODIMENTS AND BEST MODE

Figure 1:
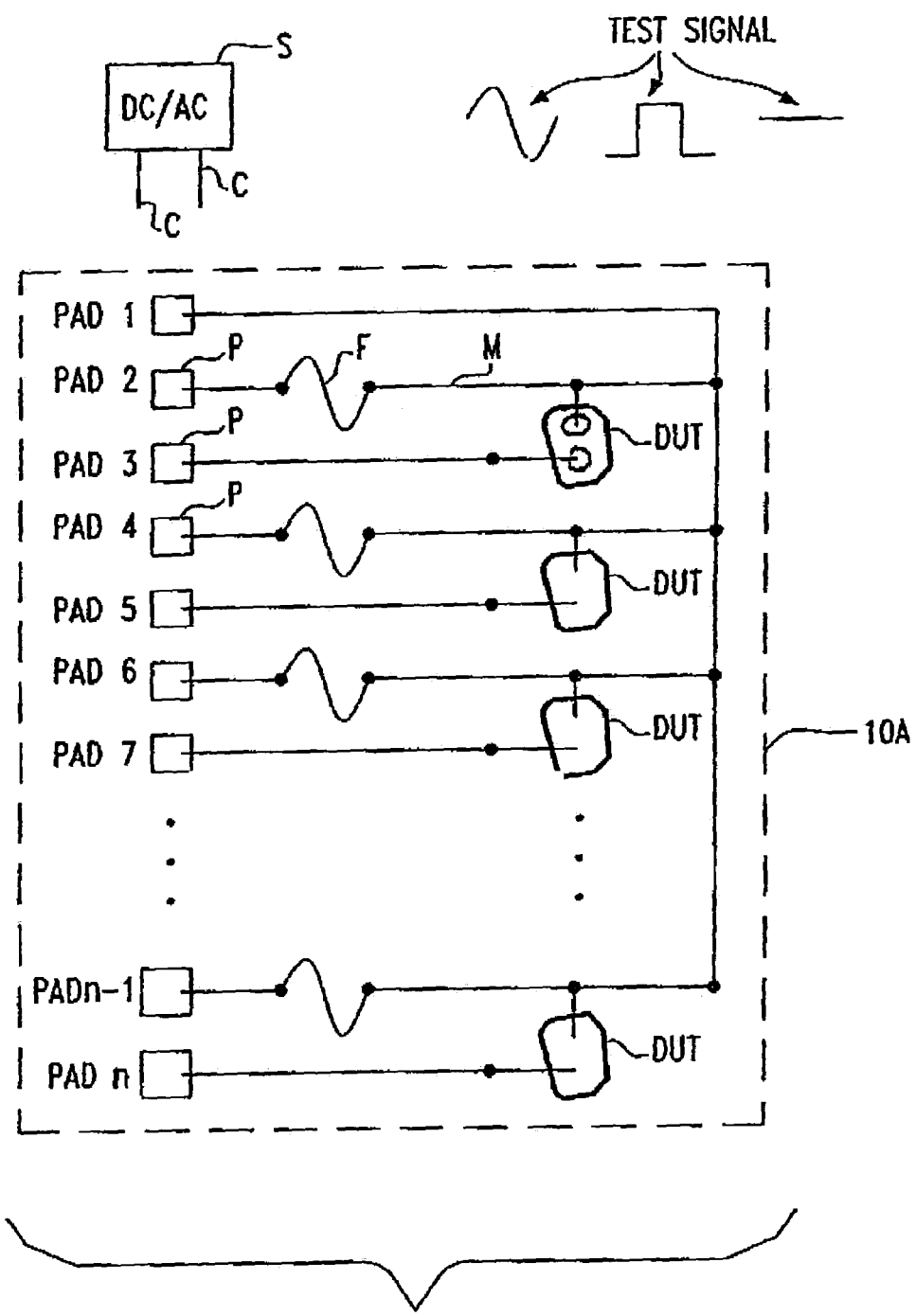
FIG. 1 is a schematic circuit diagram of a first embodiment of the invention.

As shown in FIG. 1, a semiconductor wafer 10A has disposed thereon electrically conductive probe pads P, programmable (e.g., semiconductor) fuses F, semiconductor devices under test DUT, all suitably connected by electrical conductors M such as metallization (e.g., Cu). A test signal generator S generates test signals (e.g., FIG. 1) which are applied to the pads by means of electrical connections C.

An appropriate voltage or current signal is suitably applied by the signal generators to various of the pads P to test particular devices DUT.

Devices under test are, for example, in-line process monitors such as single FETs or via chains, and defect monitors. The DUT may also be, e.g., a semiconductor memory.

The fuses F are, e.g., e-fuses such as taught in U.S. Pat. No. 6,277,674, Semiconductor Fuses, by Wang, et al., issued Aug. 21, 2001, and "A 0.13 um logic-based embedded DRAM technology with electrical fuses, Cu interconnect in SiLK, sub-7 ns random access time and its extension to the 0.10 um generation," by Klee, et al., Technical Digest, International Electron Device Meeting 2001, Washington, D.C., Dec. 2–5, 2001, pages 407–411, which are both hereby incorporated in their entireties by reference.

The present invention disposes an electrical e-fuse in series with one terminal of a two terminal DUT. One terminal of each e-fuse is connected to a probe pad. The other e-fuse terminal connects to the DUT and a common e-fuse pad.

A single metal level implementation of the invention is shown in FIG. 1. After testing the DUT between probe pads 2, 3, the e-fuse F is blown by applying a bias signal of 3.3V to pad 2 and up to 15 mA of current. Pad 2 is now reusable for other connections at higher metal levels of semiconductor processing.

Each DUT is, e.g., a two port circuit that is tested at a metal level Mx, which is an additional level of metallization in the semiconductor process. Each fuse F is an electrically programmable fuse (e-fuse), which fuse may be laid out at any level at or below where the circuit is to be tested. The e-fuse is blown by applying a bias between the pads P where the two ends of the fuse are connected.

Each level of metal is connected to the circuit and to an independent e-fuse.

Figure 2:
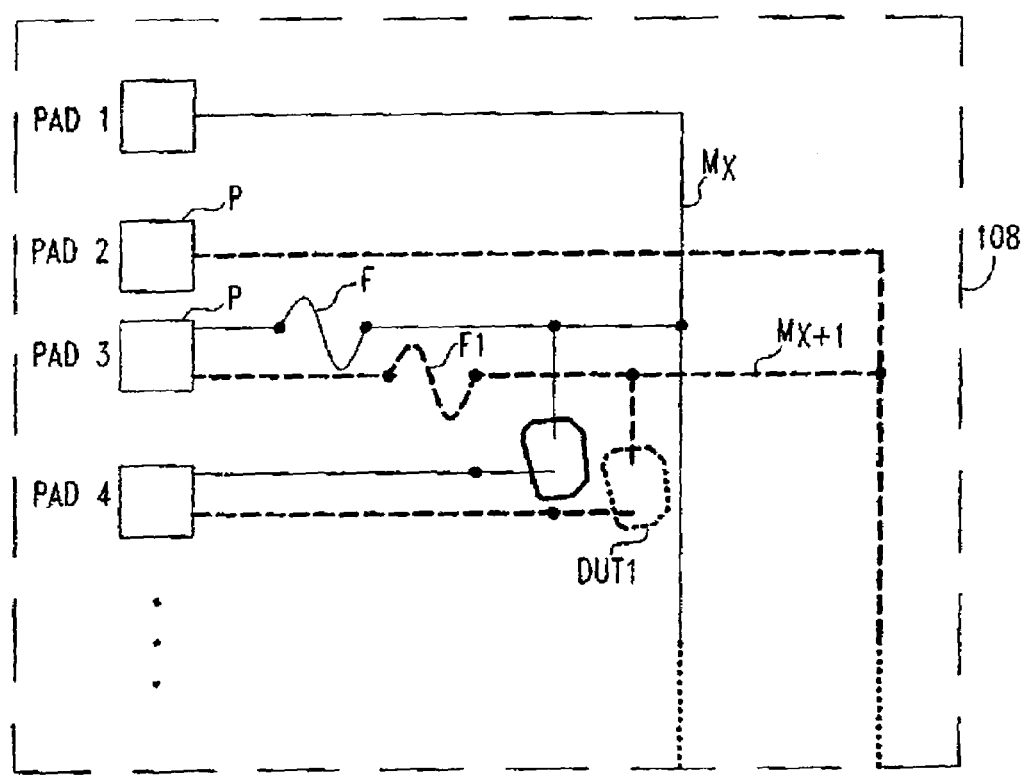
FIG. 2 is a schematic circuit diagram of a second embodiment of the invention.

The invention is extendable to blowing the e-fuses at any level of the semiconductor process. In FIG. 2 showing a wafer 10B, by adding an additional common e-fuse and probe pad per level of metallization, the e-fuses built earlier in the process can be blown at any test point.

For example, on the wafer 10B as shown in FIG. 2, a solid and dotted line represents a first level metal of processing i.e.—a first level of metallization (Mx), and the dashed and dotted line represents the next level of metallization (Mx+1). If no fuses were blown on this structure at the test level Mx, and if the Mx test date were required, the Mx+1 e-fuse could be blown by applying a bias between the probe pads 2, 3 and then testing the structure between pads 3, 4. Instead, if Mx+1 test data were desired, the e-fuse between the pads 1, 3 could be blown and a dotted structure DUT 1 between the pads 3, 4 would be the device under test.

Figure 3:
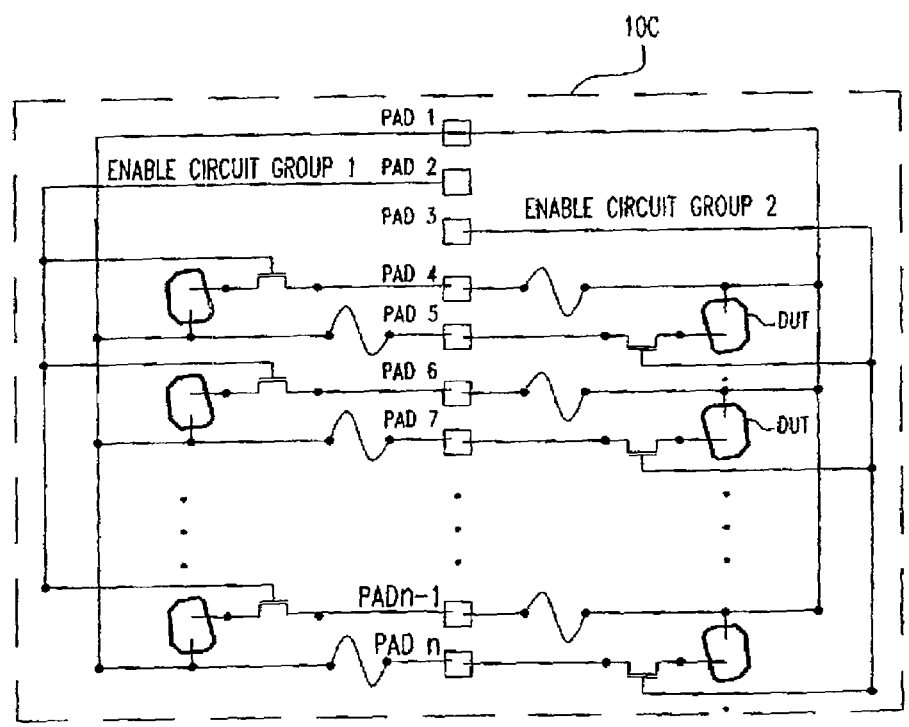
FIG. 3 is a schematic circuit diagram of a third embodiment of the invention.

This invention is also extendable by using FETs to enable/disable banks of DUTs as shown in FIG. 3 and on the wafer 10C. The use of two probe pads to control the enable signals would double the number of DUTs testable.

In general, where no fuses or multiplexing of DUTs are designed, for n probe pads there are n/2 two-point dedicated structures which can be tested. With e-fuses, given one probe pad per metal level of processing (x), the number of structures testable is $((n-x)/2)*x$. With two enable pads for multiplexing, the number of structures testable is $((n-x-2)/2)*2x$.

Thus, for 25 probe pads and four levels of metal, the number of test structures testable for each case is:

no e-fuse: 12 e-fuse only: 40 e-fuse and two-pads for multiplexing: 72.

The invention is extendible to any type of fuse (not necessarily limited to e-fuse) as long as the fuse can be programmed (e.g., blown) between manufacturing process steps and device electrical characterization steps.

What is claimed is:

1. A test arrangement, comprising:
- a semiconductor device to be tested;
- a first conductive pad electrically connected to said semiconductor device to be tested;
- a second conductive pad;
- a third conductive pad; and
- a first programmable fuse, said third conductive pad being serially electrically connected to said semiconductor device to be tested through only said first programmable fuse connected to first electrical conductors excluding said first conductive pad, wherein said second conductive ped is serially electrically connected to said third conductive pad through only a second programmable fuse connected to second electrical conductors, and wherein said second electrical conductors and said second programmable fuse are disposed at a level of metallization different than a level of metallization at which said first electrical conductors and said first programmable fuse are disposed.

2. The test arrangement as claimed in claim 1, wherein each of said first and said second programmable fuses are electrically programmable fuses.

3. The test arrangement as claimed in claim 1, wherein said semiconductor device is a two port device.

4. The test arrangement as claimed in claim 1, wherein said first programmable fuse and said second programmable fuse are semiconductor fuses.

\* \* \* \* \*